(12) United States Patent
Sawai et al.

(10) Patent No.: US 12,445,113 B2
(45) Date of Patent: Oct. 14, 2025

(54) LOW PASS FILTER AND SEMICONDUCTOR DEVICE

(71) Applicant: ABLIC Inc., Nagano (JP)

(72) Inventors: Hideyuki Sawai, Nagano (JP); Tadashi Kurozo, Nagano (JP)

(73) Assignee: ABLIC Inc., Nagano (JP)

( * ) Notice: Subject to any disclaimer, the term of this patent is extended or adjusted under 35 U.S.C. 154(b) by 48 days.

(21) Appl. No.: 18/423,304

(22) Filed: Jan. 26, 2024

(65) Prior Publication Data

US 2024/0258996 A1 Aug. 1, 2024

(30) Foreign Application Priority Data

Jan. 31, 2023 (JP) ................. 2023-012407

(51) Int. Cl.
 *H03H 11/04* (2006.01)
 *H03K 17/687* (2006.01)

(52) U.S. Cl.
 CPC ........... *H03H 11/04* (2013.01); *H03K 17/687* (2013.01)

(58) Field of Classification Search
 CPC .............................. H03H 11/04; H03K 17/687
 See application file for complete search history.

(56) References Cited

U.S. PATENT DOCUMENTS

| | | | | |
|---|---|---|---|---|
| 8,531,237 B2* | 9/2013 | Aisu | ....................... | G05F 1/575 327/558 |
| 8,922,188 B2* | 12/2014 | Sakaguchi | .............. | G05F 1/575 323/286 |
| 9,829,904 B2* | 11/2017 | Sakaguchi | ........... | H03H 11/126 |
| 11,616,505 B1* | 3/2023 | Ock | ........................ | G05F 1/56 327/558 |
| 11,909,369 B2* | 2/2024 | Chang | ..................... | H03H 7/06 |
| 2016/0149559 A1 | 5/2016 | Köllmann et al. | | |

* cited by examiner

*Primary Examiner* — Sibin Chen
(74) *Attorney, Agent, or Firm* — JCIPRNET

(57) ABSTRACT

A low pass filter and a semiconductor device including the low pass filter are capable of quickly reaching a steady state upon power-on. The low pass filter includes a first first-conductivity-type MOS transistor, an electrostatic capacitor, a buffer circuit, a bias circuit, an input terminal, and an output terminal. The input terminal is connected to a source terminal of the first first-conductivity-type MOS transistor. A drain terminal of the first first-conductivity-type MOS transistor is connected to a first terminal of the electrostatic capacitor, the output terminal, and an input terminal of the buffer circuit. An output terminal of the buffer circuit is connected to an input terminal of the bias circuit. An output terminal of the bias circuit is connected to a gate terminal of the first first-conductivity-type MOS transistor.

8 Claims, 2 Drawing Sheets

LOW PASS FILTER AND SEMICONDUCTOR DEVICE

CROSS-REFERENCE TO RELATED APPLICATION

This application claims the priority benefit of Japan application serial no. 2023-012407, filed on Jan. 31, 2023. The entirety of the above-mentioned patent application is hereby incorporated by reference herein and made a part of this specification.

BACKGROUND

Technical Field

The present invention relates to a low pass filter and a semiconductor device.

Related Art

In a case requiring a direct current voltage from which noise has been removed, a low pass filter including a resistor and an electrostatic capacitor is used. As an example, a low pass filter has been disclosed to include a MOS transistor with an area reduced compared to a resistor, an electrostatic capacitor, and a bias circuit (e.g., see the specification of US Patent Application Publication No. 2016/0149559).

For example, in the conventional low pass filter disclosed in FIG. 2a of the specification of US Patent Application Publication No. 2016/0149559, since it takes a long time to charge the filter capacitor upon power-on, it takes a long time to reach a steady state.

SUMMARY

At least one aspect of the present invention provides a low pass filter capable of quickly reaching a steady state upon power-on.

A low pass filter according to at least one aspect of the present invention includes a first first-conductivity-type MOS transistor, an electrostatic capacitor, a buffer circuit, a bias circuit, an input terminal, and an output terminal. The input terminal is connected to a source terminal of the first first-conductivity-type MOS transistor. A drain terminal of the first first-conductivity-type MOS transistor is connected to a first terminal of the electrostatic capacitor, the output terminal, and an input terminal of the buffer circuit. An output terminal of the buffer circuit is connected to an input terminal of the bias circuit. An output terminal of the bias circuit is connected to a gate terminal of the first first-conductivity-type MOS transistor.

DESCRIPTION OF EMBODIMENTS

Hereinafter, a low pass filter and a semiconductor device according to embodiments of the present invention will be described based on the drawings.

Figure 1:
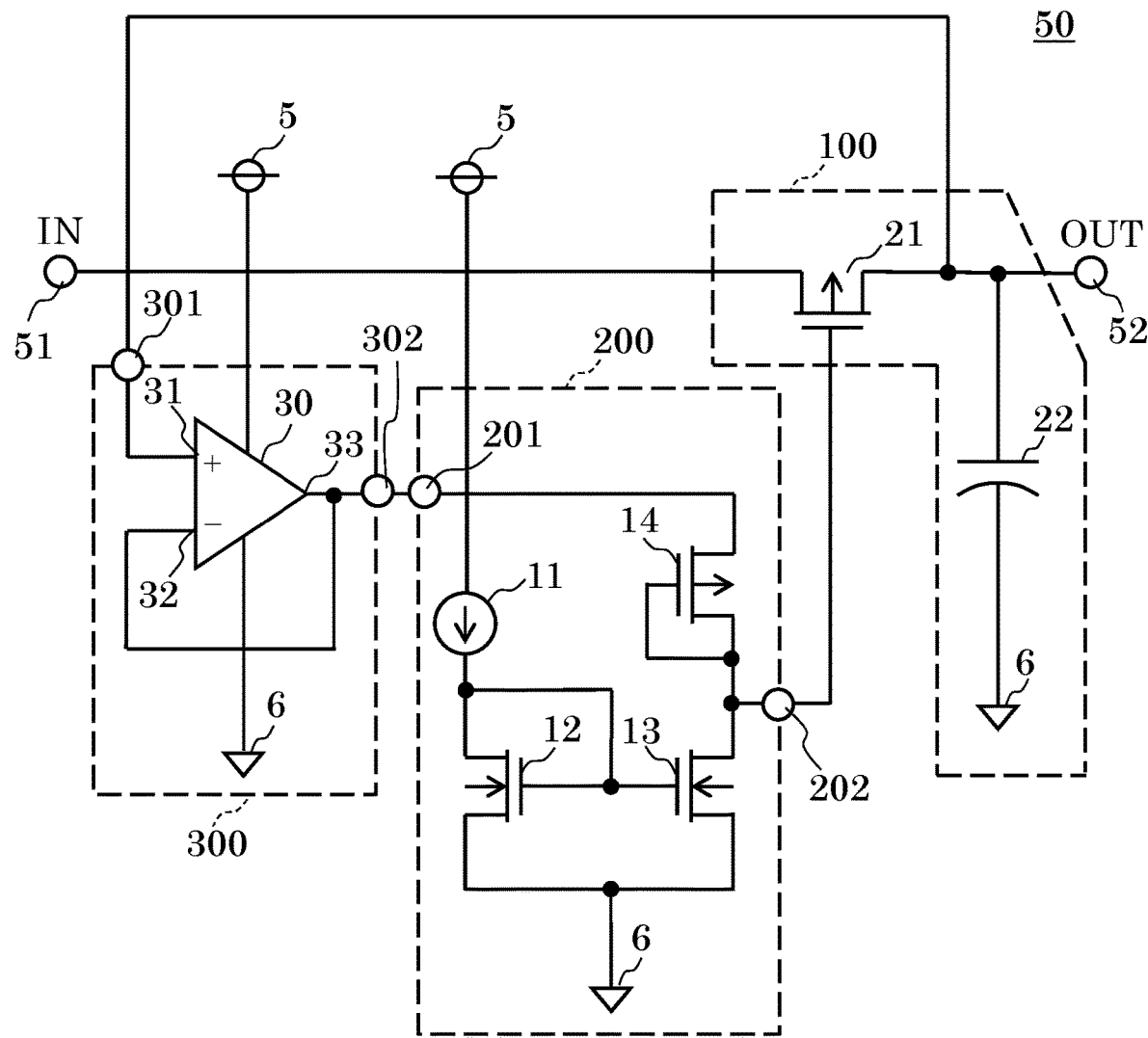
FIG. 1 is a circuit diagram illustrating a configuration example of a low pass filter according to an embodiment of the present invention.

FIG. 1 is a circuit diagram illustrating a configuration example of a low pass filter according to the present embodiment. A low pass filter 50 includes an RC circuit 100, a bias circuit 200, a buffer circuit 300, an input terminal 51, and an output terminal 52. A ground terminal 6 is a power supply terminal which supplies a power supply voltage (hereinafter referred to as a "ground voltage") of 0 V (zero volts) as an example of the power supply voltage serving as a reference for the circuit operation. A power supply terminal 5 supplies a power supply voltage which operates the bias circuit 200 and the buffer circuit 300.

The RC circuit 100 includes an enhancement-type P-channel MOS transistor (hereinafter referred to as a PMOS transistor) 21 as a resistor, and an electrostatic capacitor 22. The source terminal of the PMOS transistor 21 is connected to the input terminal 51. The drain terminal of the PMOS transistor 21 is connected to the output terminal 52. A first terminal of the electrostatic capacitor 22 is connected to the output terminal 52. A second terminal of the electrostatic capacitor 22 is connected to the ground terminal 6.

The bias circuit 200 includes a current source 11, a first enhancement-type N-channel MOS transistor (hereinafter referred to as an NMOS transistor) 12, a second NMOS transistor 13, a second PMOS transistor 14, an input terminal 201 of the bias circuit 200, and an output terminal 202 of the bias circuit 200.

A first terminal of the current source 11 is connected to the power supply terminal 5. A second terminal of the current source 11 is connected to the drain terminal and the gate terminal of the first NMOS transistor 12 and the gate terminal of the second NMOS transistor 13. The source terminal of the first NMOS transistor 12 and the source terminal of the second NMOS transistor 13 are connected to the ground terminal 6. The drain terminal of the second NMOS transistor 13 is connected to the drain terminal and the gate terminal of the second PMOS transistor 14 and the output terminal 202. The input terminal 201 is connected to the source terminal of the second PMOS transistor 14.

The buffer circuit 300 includes an operational amplifier circuit 30, an input terminal 301, and an output terminal 302. The input terminal 301 is connected to a non-inverting input terminal 31 of the operational amplifier circuit 30. An output terminal 33 of the operational amplifier circuit 30 is connected to an inverting input terminal 32 of the operational amplifier circuit 30 and the output terminal 302 of the buffer circuit 300. A first power supply terminal of the operational amplifier circuit 30 is connected to the power supply terminal 5. A second power supply terminal is connected to the ground terminal 6.

The gate terminal of the first PMOS transistor 21 of the RC circuit 100 is connected to the output terminal 202 of the bias circuit 200. The input terminal 201 of the bias circuit 200 is connected to the output terminal 302 of the buffer circuit 300. The input terminal 301 of the buffer circuit 300 is connected to the output terminal 52.

Next, the operation of the low pass filter 50 will be described.

The power supply terminal 5 supplies a predetermined power supply voltage. The ground terminal 6 supplies a ground voltage. In the first PMOS transistor 21 of the RC circuit 100, the larger the absolute value of the source-gate voltage, the smaller the on-resistance between the source and the drain. Conversely, the smaller the absolute value of the source-gate voltage, the larger the on-resistance between the source and the drain. The charge stored in the electrostatic capacitor 22 is zero at power-on. The second terminal of the electrostatic capacitor 22 is connected to the ground terminal 6, and the voltage of the output terminal 52 is 0 V.

Due to the connection relationship described above, the voltage of the output terminal 52 is conducted to the non-inverting input terminal 31 of the operational amplifier circuit 30. That is, 0 V is conducted to the non-inverting input terminal 31. With the output terminal 33 and the inverting input terminal 32 directly connected with each other, the operational amplifier circuit 30 performs an operation called a voltage follower. That is, the operational amplifier circuit 30 operates to output, at the output terminal 33, a voltage equal to the voltage of the non-inverting input terminal 31. Thus, the output terminal 33 outputs 0 V, which is the voltage of the output terminal 52.

The output terminal 302 of the buffer circuit 300 has the current supply capability of the output terminal 33 of the operational amplifier circuit 30. At this moment, since the voltage outputted by the output terminal 33 is 0 V, the output terminal 302 of the buffer circuit 300 does not supply a current. Due to the connection relationship described above, 0 V is received by the input terminal 201 of the bias circuit 200.

On the other hand, since the current source 11 is already applied with the power supply voltage, the current source 11 outputs a predetermined current. The drain terminal and the gate terminal of the first NMOS transistor 12 are directly connected with each other. The gate voltage of the first NMOS transistor 12 is settled such that the drain current of the first NMOS transistor 12 becomes a value equal to the current of the current source 11. The gate terminal of the second NMOS transistor 13 is applied with the voltage of the gate terminal of the first NMOS transistor 12. The second NMOS transistor 13 is on. Due to the connection relationship described above, the voltage of the source terminal of the second PMOS transistor 14 is 0 V. Thus, at this moment, no current flows through the second PMOS transistor 14. The output terminal 202 of the bias circuit outputs 0 V. Due to the connection relationship described above, since the voltage of the gate terminal of the first PMOS transistor 21 of the RC circuit 100 is 0 V, the first PMOS transistor 21 becomes fully on (on-state with a small on-resistance). In this manner, upon power-on, the electrostatic capacitor 22 of the RC circuit 100 is immediately charged.

Upon charging of the electrostatic capacitor 22, the voltage of the output terminal 52 becomes almost equal to the voltage of the input terminal 51. Then, the input terminal 301 and the output terminal 302 of the buffer circuit 300 become equal to the voltage of the output terminal 52. The voltage of the output terminal 302 of the buffer circuit 300 is received by the input terminal 201 of the bias circuit 200. The first NMOS transistor 12 and the second NMOS transistor 13 constitute a current mirror. Thus, a current of the same magnitude as the current outputted by the current source 11 is to flow to the drain terminal of the second NMOS transistor 13. Further, a current of the same magnitude of the current of the current source 11 is to flow to the drain terminal of the second PMOS transistor 14 connected between the input terminal 201 and the second NMOS transistor 13. Then, the source-gate voltage of the second PMOS transistor 14 becomes a value corresponding to the magnitude of the current of the current source 11 and the size ratio between the first NMOS transistor 12 and the second NMOS transistor 13.

At this time, the drain voltage of the second PMOS transistor 14 is provided to the gate of the first PMOS transistor 21 via the output terminal 202. The first PMOS transistor 21 operates at a source-gate voltage equal to the source-gate voltage of the second PMOS transistor 14. In this manner, the first PMOS transistor 21 operates as a resistor with an equivalently large resistance value.

The first PMOS transistor 21 and the electrostatic capacitor 22 operate as a low pass filter which attenuates noise in the voltage received by the input terminal 51. With the low pass filter 50, it is possible to obtain, from the output terminal 52, a direct current voltage from which noise has been removed.

The low pass filter 50 illustrated in FIG. 1 has been described as a positive voltage circuit in which a positive voltage is applied to the power supply terminal 5 and input terminal 51 with respect to the ground terminal 6. The low pass filter 50 may also be a negative voltage circuit in which a negative voltage is applied to the power supply terminal 5 and input terminal 51 with respect to the ground terminal 6. In the low pass filter 50 configured as the negative voltage circuit, the NMOS transistors in the low pass filter 50 illustrated in FIG. 1 are replaced with PMOS transistors, and the PMOS transistors in the low pass filter 50 illustrated in FIG. 1 are replaced with NMOS transistors.

As described above, with the low pass filter 50, it is possible to provide a low pass filter capable of quickly reaching a steady state upon power-on without the need to additionally provide control circuits such as a control circuit for startup of the first PMOS transistor 21. Further, since it is not required to additionally provide control circuits such as a control circuit for startup of the first PMOS transistor 21, the low pass filter 50 is capable of avoiding an increase in current consumption.

Figure 2:
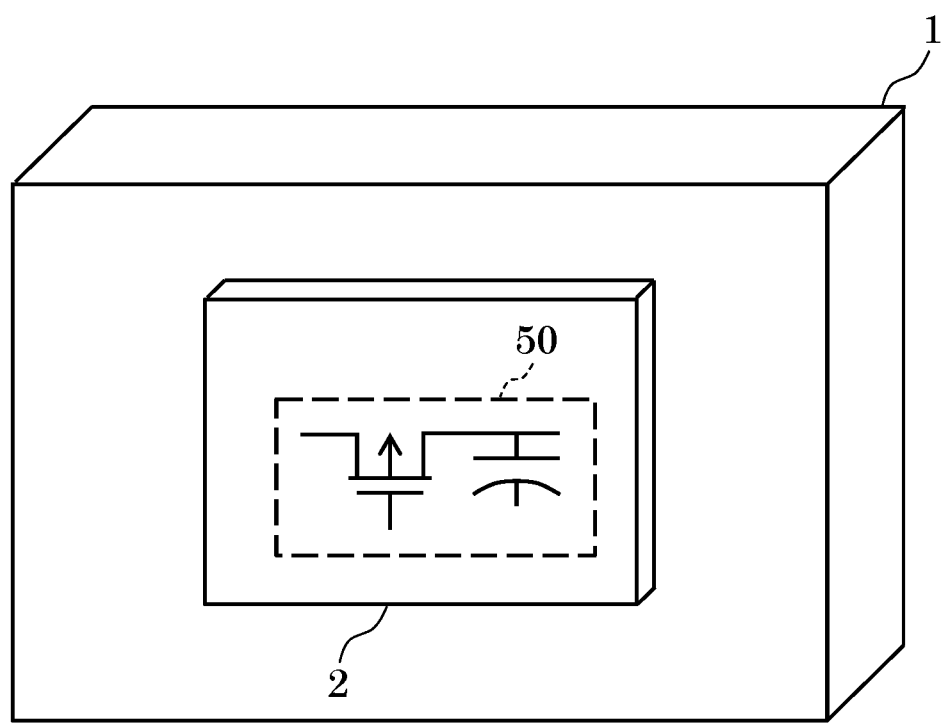
FIG. 2 is a schematic diagram illustrating a configuration example of a semiconductor device according to an embodiment of the present invention.

FIG. 2 is a schematic diagram illustrating a configuration example of a semiconductor device according to the present embodiment. A semiconductor device 1 incorporates a semiconductor substrate 2 on which the low pass filter 50 is formed. With the low pass filter 50 applied to the power supply circuit, the semiconductor device 1 is capable of operating with a direct current voltage from which noise has been removed. Further, the semiconductor device 1 is capable of quickly reaching a steady state upon power-on.

As described above, according to the low pass filter and the semiconductor device related to at least one aspect of the present invention, it is possible to reach a steady state more quickly upon power-on.

The present invention is not limited to the embodiments described above, but may be implemented in various forms other than the above-described examples at the implementation stage. Various omissions, additions, replacements, or changes may be made within the scope without departing from the gist of the invention. These embodiments and their modifications are included in the scope and gist of the invention, and are included in the invention described in the claims and the equivalent range thereof.

What is claimed is:

1. A low pass filter comprising: a first first-conductivity-type MOS transistor, an electrostatic capacitor, a buffer circuit including an operational amplifier circuit, a bias circuit, an input terminal, and an output terminal, wherein
   the input terminal is connected to a source terminal of the first first-conductivity-type MOS transistor,
   a drain terminal of the first first-conductivity-type MOS transistor is connected to a first terminal of the electrostatic capacitor, the output terminal, and an input terminal of the buffer circuit,
   an output terminal of the operational amplifier circuit is connected to an inverting input terminal of the operational amplifier circuit and an output terminal of the buffer circuit, the output terminal of the buffer circuit is connected to an input terminal of the bias circuit, and an output terminal of the bias circuit is connected to a gate terminal of the first first-conductivity-type MOS transistor.

2. The low pass filter according to claim 1, wherein
a second terminal of the electrostatic capacitor is connected to a first power supply terminal.

3. The low pass filter according to claim 1, wherein
the bias circuit comprises a current source, a first second-conductivity-type MOS transistor, a second second-conductivity-type MOS transistor, a second first-conductivity-type MOS transistor, the input terminal of the bias circuit, and the output terminal of the bias circuit,
a first terminal of the current source is connected to a second power supply terminal,
a second terminal of the current source is connected to a drain terminal and a gate terminal of the first second-conductivity-type MOS transistor and a gate terminal of the second second-conductivity-type MOS transistor,
a source terminal of the first second-conductivity-type MOS transistor and a source terminal of the second second-conductivity-type MOS transistor are connected to a first power supply terminal,
a drain terminal of the second second-conductivity-type MOS transistor is connected to a drain terminal and a gate terminal of the second first-conductivity-type MOS transistor and the output terminal of the bias circuit, and
the input terminal of the bias circuit is connected to a source terminal of the second first-conductivity-type MOS transistor.

4. The low pass filter according to claim 1, wherein
the buffer circuit comprises the operational amplifier circuit, the input terminal of the buffer circuit, and the output terminal of the buffer circuit, and
the input terminal of the buffer circuit is connected to a non-inverting input terminal of the operational amplifier circuit.

5. A semiconductor device comprising:
a semiconductor substrate; and
a low pass filter formed on the semiconductor substrate, wherein
the low pass filter includes a first first-conductivity-type MOS transistor, an electrostatic capacitor, a buffer circuit including an operational amplifier circuit, a bias circuit, an input terminal, and an output terminal,
the input terminal is connected to a source terminal of the first first-conductivity-type MOS transistor,
a drain terminal of the first first-conductivity-type MOS transistor is connected to a first terminal of the electrostatic capacitor, the output terminal, and an input terminal of the buffer circuit,
an output terminal of the operational amplifier circuit is connected to an inverting input terminal of the operational amplifier circuit and an output terminal of the buffer circuit,
the output terminal of the buffer circuit is connected to an input terminal of the bias circuit, and
an output terminal of the bias circuit is connected to a gate terminal of the first first-conductivity-type MOS transistor.

6. The semiconductor device according to claim 5, wherein
a second terminal of the electrostatic capacitor is connected to a first power supply terminal.

7. The semiconductor device according to claim 5, wherein
the bias circuit comprises a current source, a first second-conductivity-type MOS transistor, a second second-conductivity-type MOS transistor, a second first-conductivity-type MOS transistor, the input terminal of the bias circuit, and the output terminal of the bias circuit,
a first terminal of the current source is connected to a second power supply terminal,
a second terminal of the current source is connected to a drain terminal and a gate terminal of the first second-conductivity-type MOS transistor and a gate terminal of the second second-conductivity-type MOS transistor,
a source terminal of the first second-conductivity-type MOS transistor and a source terminal of the second second-conductivity-type MOS transistor are connected to a first power supply terminal,
a drain terminal of the second second-conductivity-type MOS transistor is connected to a drain terminal and a gate terminal of the second first-conductivity-type MOS transistor and the output terminal of the bias circuit, and
the input terminal of the bias circuit is connected to a source terminal of the second first-conductivity-type MOS transistor.

8. The semiconductor device according to claim 5, wherein
the buffer circuit comprises the operational amplifier circuit, the input terminal of the buffer circuit, and the output terminal of the buffer circuit, and
the input terminal of the buffer circuit is connected to a non-inverting input terminal of the operational amplifier circuit.

* * * * *